United States Patent [19]

Lee et al.

[11] Patent Number: 5,546,401

[45] Date of Patent: Aug. 13, 1996

[54] FRAME PHASE ALIGNER

[75] Inventors: Sang H. Lee; Jung H. Ko; Tae H. Lee; Chang S. Shim, all of Daejeon, Rep. of Korea

[73] Assignee: Electronics and Telecommunications Research Institute, Seoul, Rep. of Korea

[21] Appl. No.: 360,032

[22] Filed: Dec. 20, 1994

[30] Foreign Application Priority Data

Dec. 21, 1993 [KR] Rep. of Korea .................. 1993-28932

[51] Int. Cl.$^6$ ..................................................... H04J 3/06
[52] U.S. Cl. .......................................................... 370/105.1
[58] Field of Search ............................ 370/105.1, 105.3, 370/100.1, 112, 97; 375/371

[56] References Cited

U.S. PATENT DOCUMENTS

| | | | |
|---|---|---|---|
| 4,434,485 | 3/1984 | Huffman et al. | 370/55 |
| 5,278,873 | 1/1994 | Lowrey et al. | 375/371 |
| 5,331,641 | 7/1994 | Parruck et al. | 370/105.1 X |
| 5,333,136 | 7/1994 | Ahn | 370/112 |
| 5,408,463 | 4/1995 | Merchant et al. | 370/100.1 X |

OTHER PUBLICATIONS

IEEE Journal of Solid-State Circuits, vol. 23, No. 2, Apr. 1988, pp. 323-328 "A 45-Mbit/s CMOS VLSI Digital Phase Aligner", Robert R. Cordell.

*Primary Examiner*—Douglas W. Olms
*Assistant Examiner*—Min Jung
*Attorney, Agent, or Firm*—Spencer & Frank

[57] ABSTRACT

A frame phase aligner for a transfer system includes selection circuitry for selecting one of a plurality of input signal groups, which include data, a clock signal, an inverse clock signal and a frame synchronous signal, received from outside of the frame phase aligner. A selection signal generator provides the selection circuitry with a selection signal according to write data input from outside of the frame phase aligner, so that the selection circuitry selects one of the plurality of input signal groups according to the selection signal indicative of the setup environment of the transfer system. A control signal generator generates control clock signals and a retiming control signal in order to demultiplex selected data of the input signal group selected. A demultiplexer demultiplexes data selected to form parallel data, retimes the parallel data, and controls the phase of the parallel data according to the control retiming signal and the control clock signals output from the control signal generator. A multiplexer synchronizes the demultiplexed data output from the demultiplexer to a reference frame synchronous signal and reference control signals, and a reference control signal generator provides the reference frame synchronous signal and the reference control signals for the multiplexer.

9 Claims, 10 Drawing Sheets

5,546,401

FRAME PHASE ALIGNER

BACKGROUND OF THE INVENTION

FIELD OF THE INVENTION

The present invention relates to a frame phase aligner which synchronously outputs the input data having different time deviations according to the reference frame signal.

Referring to FIG. 1 which shows a configuration of a conventional digital transfer system, a high speed receiver unit 1 receives and demultiplexes high speed serial data, and outputs a low speed parallel through-data group, clock and frame synchronous signal groups. A tributary interface unit 3 receives asynchronous data signal-3 As-3 and performs signal processing for DS-3 and then outputs an add-data group, clock and frame synchronous signal groups. These through-data and add-data groups and clock and frame synchronous signal groups will be selected, at a high speed signal transmitter unit 2, by a simple 2:1 selection method, and subsequently will be multiplexed in the form of high speed serial data.

The through-data and add-data, and clock and frame synchronous signals are to have time deviations in the view point of their arrival time at a high speed transmitter unit 2. In the case where big time deviations occur, these signals can not be synchronized and multiplexed correctly, that is, failures and errors in transferring data, which are detrimental obstructing factors to digital transport systems, can occur.

In other words, in the case where a multiplexing circuit used in the above synchronous digital transport systems distributes frame-synchronous signals and then receives back digital signals which are frame-synchronized to the distributed signals, the signals received back should in phase with each other, frame phase as well as bit phase. Due to variations in the delay time of passive components such as the length of pattern of signal flows and those of digital active components, the signals received back are to have time deviations. Accordingly, the digital transport system must clear these time deviations to correct retiming for arriving signals.

SUMMARY OF THE INVENTION

To provide a frame phase aligner, comprising selection means for selecting one of input signal groups, which include data, a clock signal, an inverse clock signal and a frame synchronous signal from outside of said frame phase aligner; selection signal generating means for providing said selection means with a selection signal according to write data inputted from outside of said frame phase aligner so that said selection means selects one of the input signal groups according to the selection signal indicative of the setup environment of the system; control signal generating means for generating control clock signals and a retiming control signal in order to demultiplex the selected data of the input signal group which have been selected by said selection means; demultiplexing means for demultiplexing by the data selected at said selection means to parallel data, retiming the parallel data and controlling the phase of the parallel data according to the control retiming signal and the control clock signals output from said control signal generating means, respectively; multiplexing means for synchronizing the demultiplexed data output from said demultiplexing means to a reference frame synchronous signal and a reference control signals; and reference control signal generating means for providing the reference frame synchronous signal and the reference control signals for said multiplexing means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
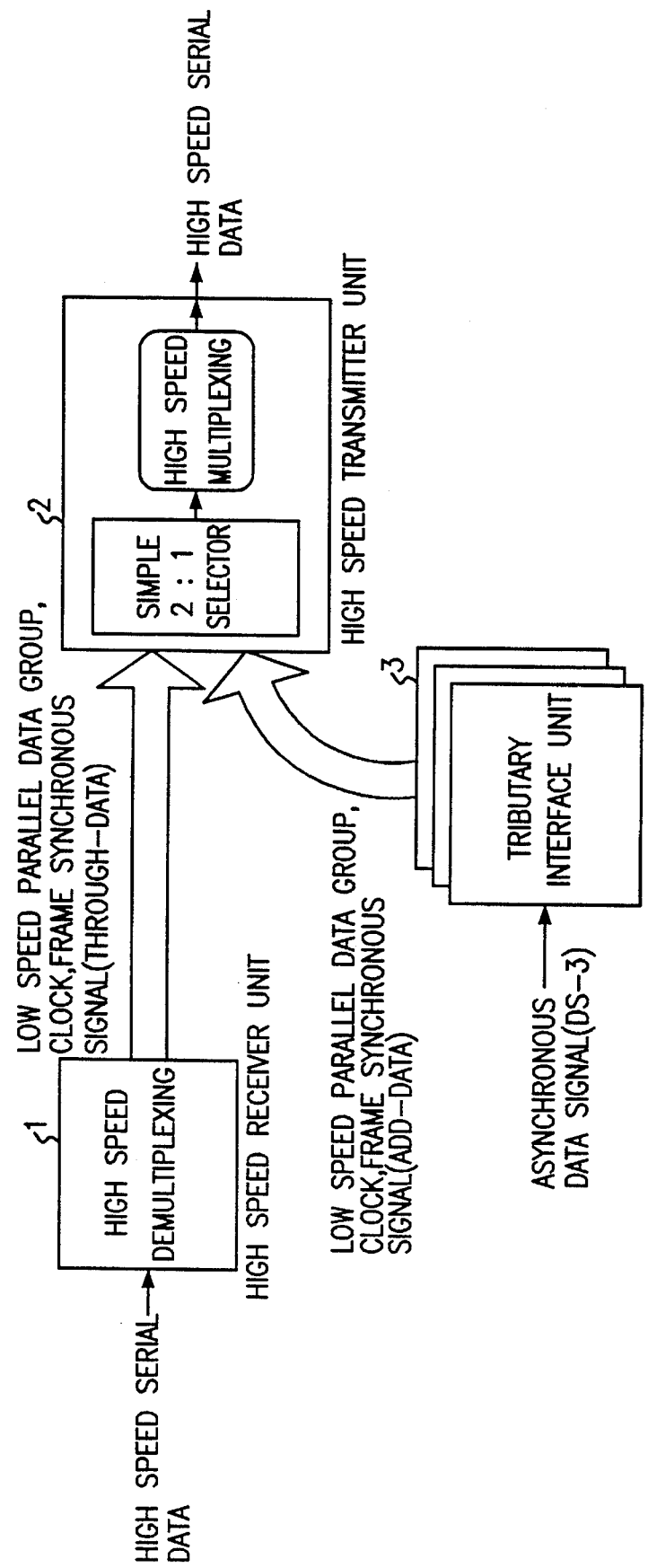
FIG. 1 shows a configuration of a conventional digital transfer system.
Figure 2:
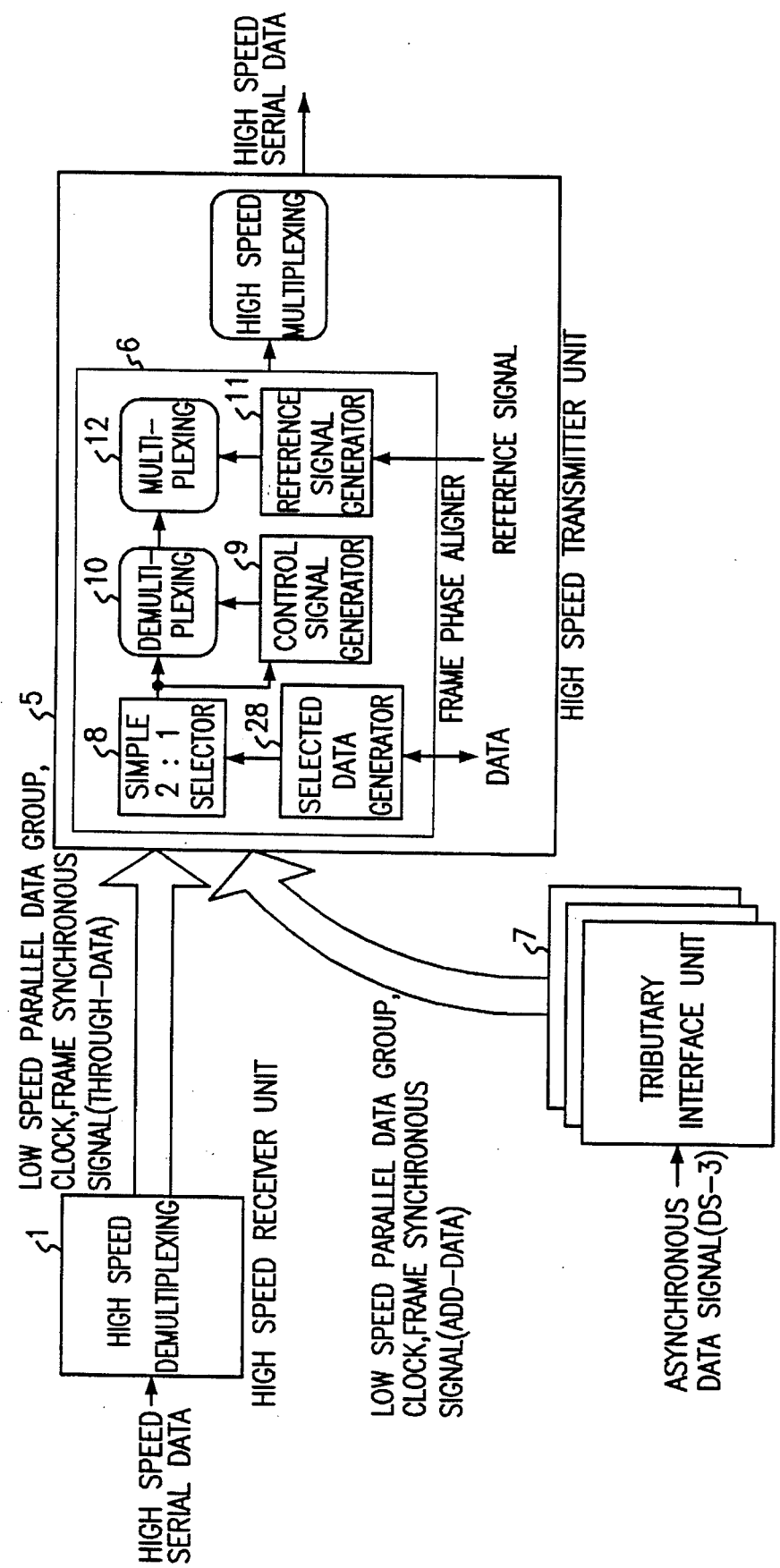
FIG. 2 shows a structure of a transfer system to whose high speed signal transmitter unit a frame phase aligner is applied according to the present invention.

FIG. 2 shows a structure of a transfer system to whose high speed signal transmitter unit 5 a frame phase aligner 6 is applied according to the present invention. In other words, through-data, clock and frame synchronous signals are outputted from high speed receiver unit 1 to be inputted to simple 2:1 selector 8. Add-data, clock and frame synchronous signals are outputted from tributary interface unit 7 to be also inputted to said simple 2:1 selector. Said simple 2:1 selector 8 selects one of the data inputted by the data outputted from selection signal generator 28 according to the system setup environment.

The clock and frame synchronous signal selected in the above are inputted to demultiplexer 10 and control signal generator 9. Said control signal generator 9 generates and inputs to said demultiplexer 10 the control signals for demultiplexing the data selected according to the data to be inputted. Said demultiplexer 10 demultiplexes said selected data to low speed data according to the control signals to be inputted. At this time, the demultiplexing is to be carried out so that multiplexing can be performed again, according to a reference signal, in the central portion of the data demultiplexed.

The signals demultiplexed as mentioned above are to be multiplexed, synchronized and outputted, at a multiplexer by a reference signal and a reference clock which are outputted from a reference signal generator 11.

Figure 3:
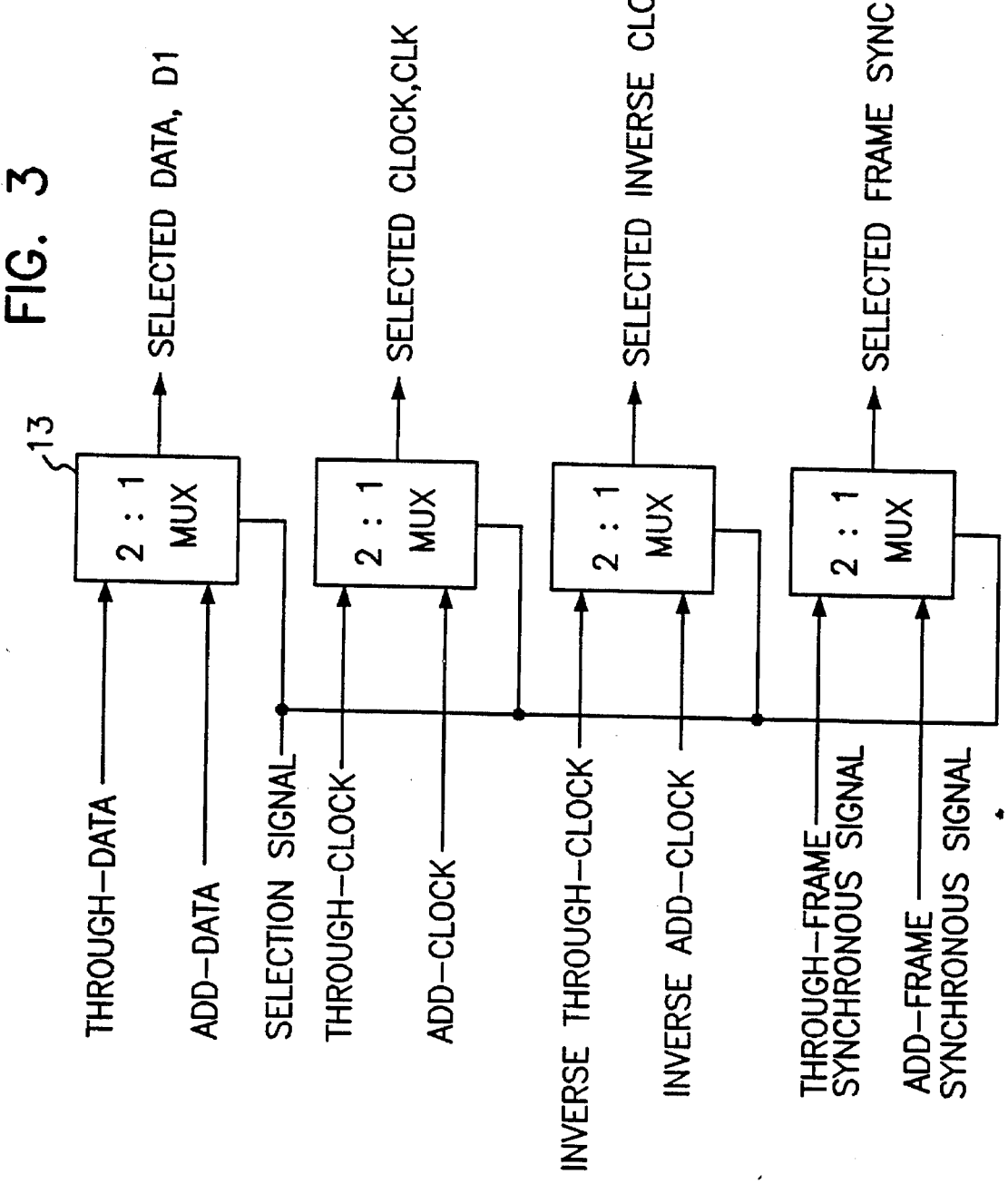
FIG. 3 illustrates a detailed circuit diagram of simple 2:1 selector shown in FIG. 2.

FIG. 3 illustrates a detailed circuit diagram of simple 2:1 selector 8 shown in FIG. 2.

The data outputted from said high speed signal receiver unit 4 and tributary interface unit 7, namely such as through-data and add-data, through-clock and add-clock, the inverse of the through-clock and the inverse of add-clock, through-frame synchronous signal and add-frame synchronous signal, are respectively inputted to the input terminals of a 2:1 multiplexer 13, selected according to a selection signal outputted from said selection signal generator 28 and outputted in the unit of one of the two signal groups, namely, such as a through-data signal, a through-clock signal, the inverse of the through-clock signal and a through-frame synchronous signal or such as an add-data signal, an add-clock signal and the inverse of the add-clock signal and an add-frame synchronous signal.

Figure 4:
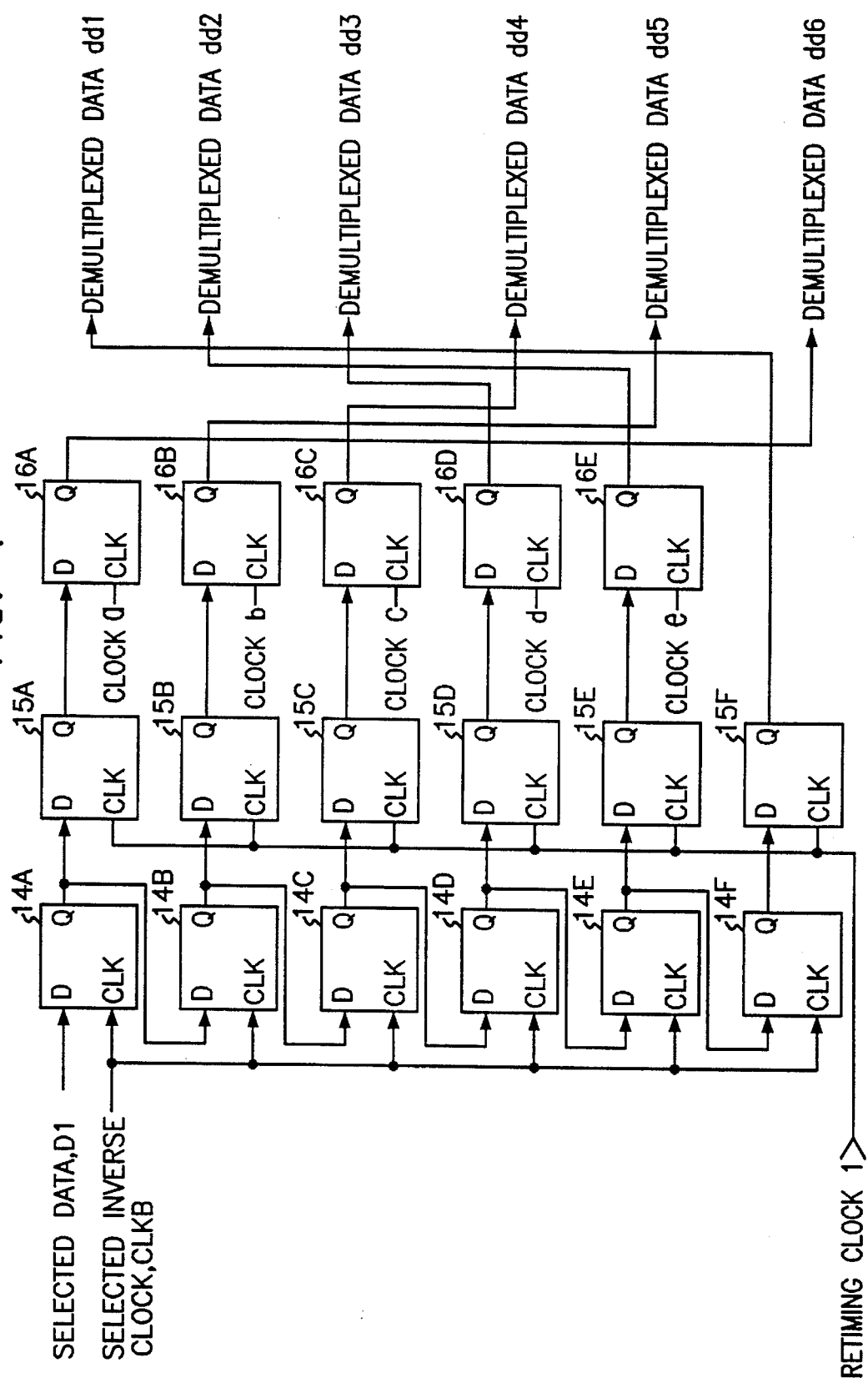
FIG. 4 shows a detailed circuit diagram of demultiplexer of FIG. 2.

FIG. 4 shows a detailed circuit diagram of a demultiplexer 10 of FIG. 2.

Firstly, the data D1 selected from the simple 2:1 selector 8 are inputted to a data input terminal of a flip-flop 14A and then outputted through its output terminal according to the inverse of the selected clock also selected at the simple 2:1 selector 8. The data selected as mentioned above are inputted to a data input terminal of a flip-flop 15A of a retiming flip-flop group 15 and also to a data input terminal of a flip-flop 14B below the flip-flop 14A. Likewise, said flip-flop 14B outputs data through its output terminal, according to the inverse of the selected clock also selected at the simple 2:1 selector 8, toward a data input terminal of a flip-flop 15B of a retiming flip-flop group 15 and also to a data input terminal of a flip-flop 14C below.

In the same manner as above, the output data from the flip-flops 14C, 14D, 14E and 14F are inputted to the data input terminal of the flip-flops 15C, 15D, 15E and 15F of the retiming flip-flop group 15. The flip-flops 15C, 15D, 15E and 15F of said retiming flip-flop group 15 output retiming data according to a retiming clock 1 outputted from the control signal generator 9 and input the retiming data respectively to a data input terminal of the flip-flops 16C, 16D and 16E of a flip-flop group 16. Said flip-flop 16, which creates final demultiplexed data, outputs sequentially the data dd1, dd2, dd3, dd4, dd5, and dd6 which are demultiplexed by the sequential clocks - retiming clock 1, clock e, clock d, clock c, clock b and clock a - that have different time deviations among one another and have been made by said control signal generator 9.

Figure 5:
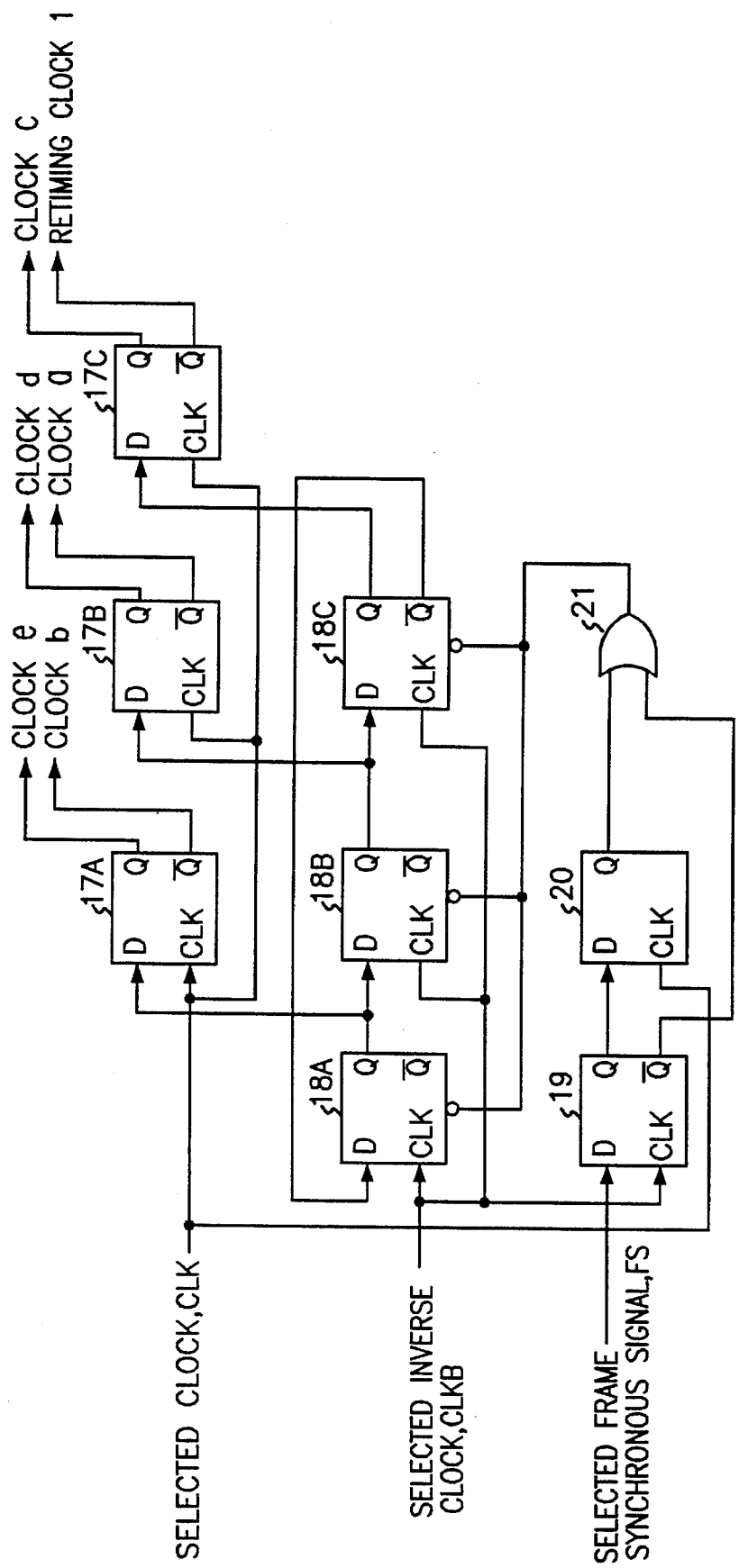
FIG. 5 is a detailed circuit diagram of a control signal generator of FIG. 2.

FIG. 5 is a detailed circuit diagram of a control signal generator 9 of FIG. 2

Clock signals divided by 6 are produced, according to the inverse of a selected clock CLKB, by a 3-bit counter circuit 18 consisting of three flip-flops 18A, 18B and 18C, whose clock signals are respectively inputted to the data input terminals of three flip-flops 17A, 17B and 17C that generate the control signals to be applied to a demultiplexer 10. The flip-flops 17A, 17B and 17C produce, according to the retiming of a selected clock CLK, the clocks with different time interval - clock e, clock b, clock d, clock a, clock c and retiming clock 1.

In the mean time, a flip-flop 19 receives an input of a selected frame synchronous signal FS and applies the data outputted, according to the inverse of the selected clock, to the data input terminal of a flip-flop 20, which outputs data according to a selected clock. An OR gate 21 resets said counter circuit 18 by performing an OR logic operation for the inverted output of said flip-flop 19 and the output of said flip-flop 20 and generating a pulse signal for maintaining a logic level "0" during a half of the period of the frame synchronous signal inputted.

Figure 6:
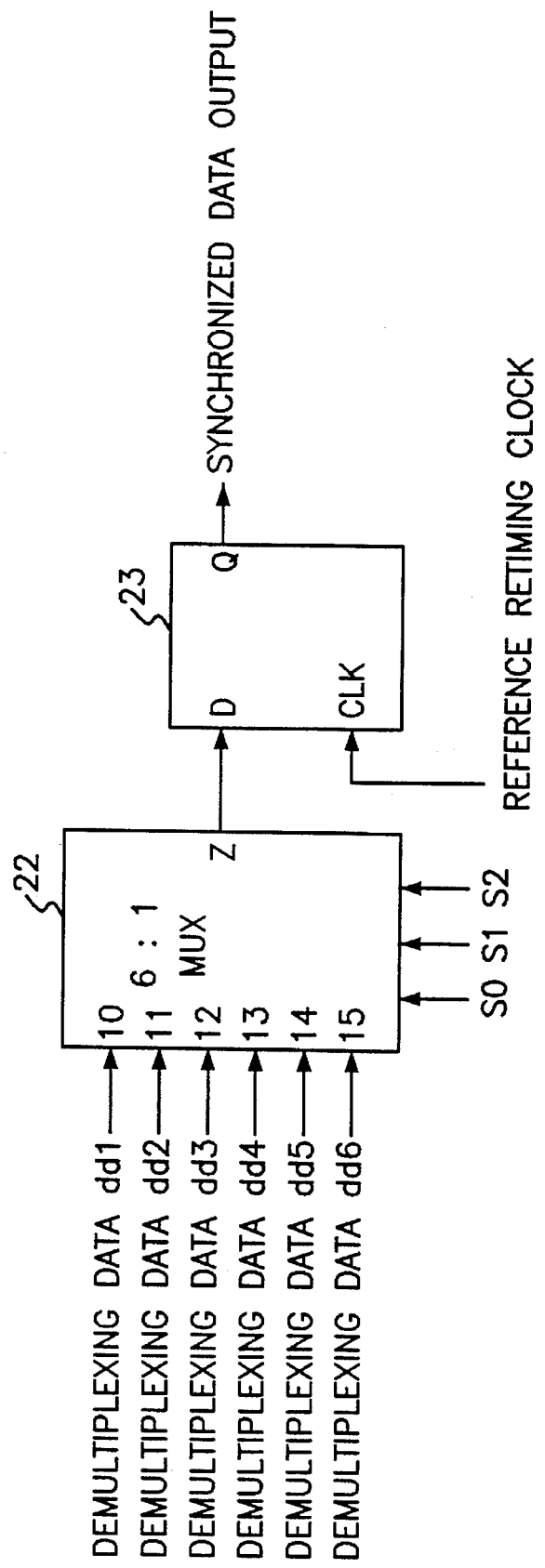
FIG. 6 is a detailed circuit diagram of a multiplexer of FIG. 2.

FIG. 6 is a detailed circuit diagram of a multiplexer 12 of FIG. 2.

Sequential and demultiplexed data dd1, dd2, dd3, dd4, dd5, and dd6 produced at said demultiplexer 10, are inputted to a 6:1 multiplexer 22 which outputs multiplexed data according to a control signal generated at a signal generator 11. A flip-flop 23 performs a retiming for the multiplexed output data, according to a reference retiming clock RCLK to output final synchronous data.

Figure 7:
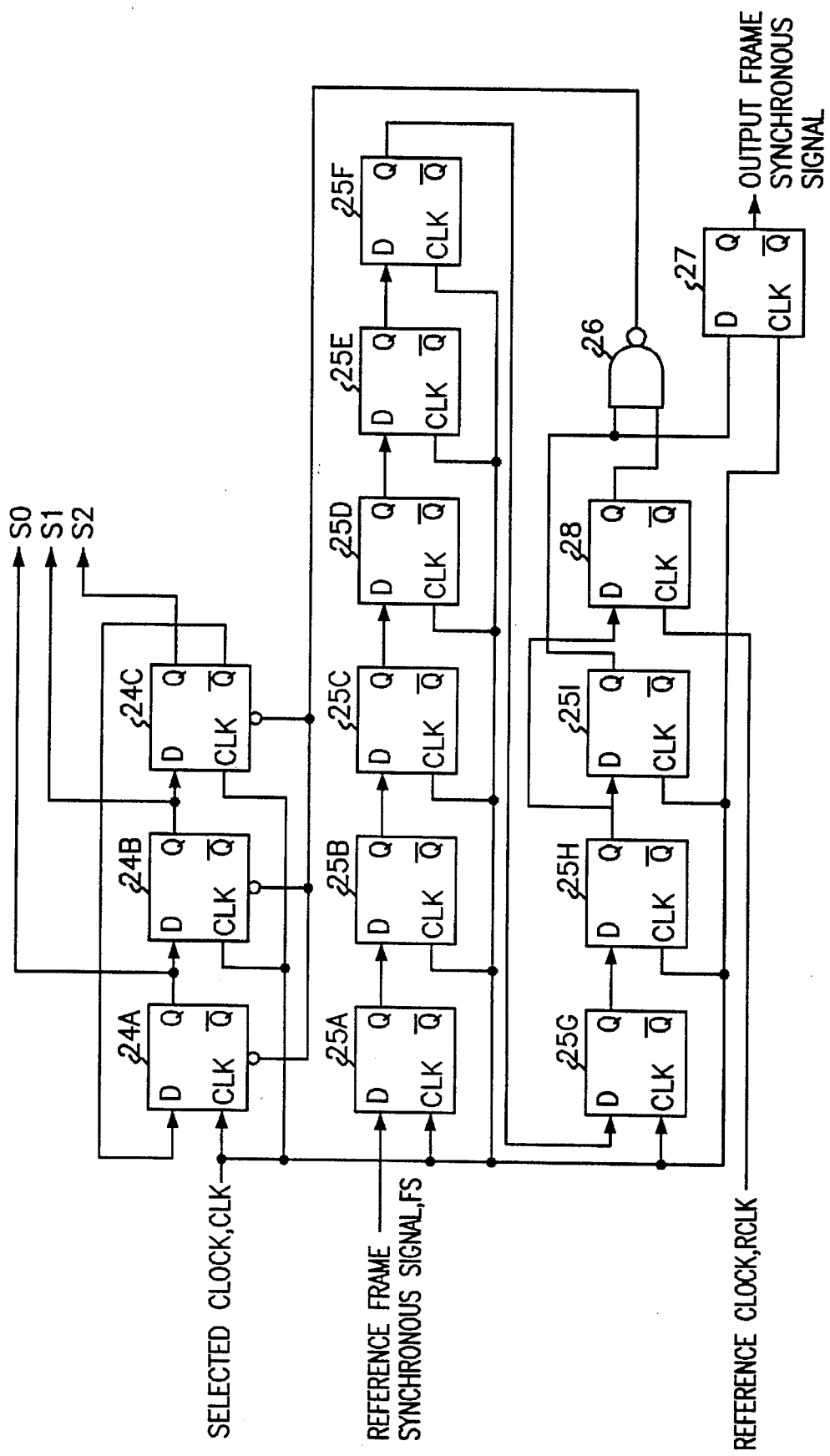
FIG. 7 shows a detailed circuit diagram for a reference signal generator shown in FIG. 2.

FIG. 7 shows a detailed circuit diagram for a reference signal generator 11 shown in FIG. 2.

A 3-bit counter circuit 24 consisting of three flip-flops 24A, 24B and 24C generates three control signals S0, S1 and S2 which will be supplied to multiplexing means 12.

In the mean time, nine serially-connected flip-flops 25A through 25I receive the input of reference frame synchronous signals FS, delay and output the above input signal according to the inverse of a reference clock CLKB. A flip-flop 28 receives the output of a flip-flop 25H, as its input, and produces data according to a reference clock RCLK. A NAND gate 26 resets said counter circuit 24 by performing a NAND logic operation for the output of said flip-flop 25I and the output of said flip-flop 28 and generating a pulse signal for maintaining a logic level "0" during a half of the period of the reference frame synchronous signal inputted.

The output of said flip-flop 25I is inputted to a flip-flop 27 which outputs an output frame synchronous signal FS0 according to the inverse of a reference clock CLKB.

Figure 8:
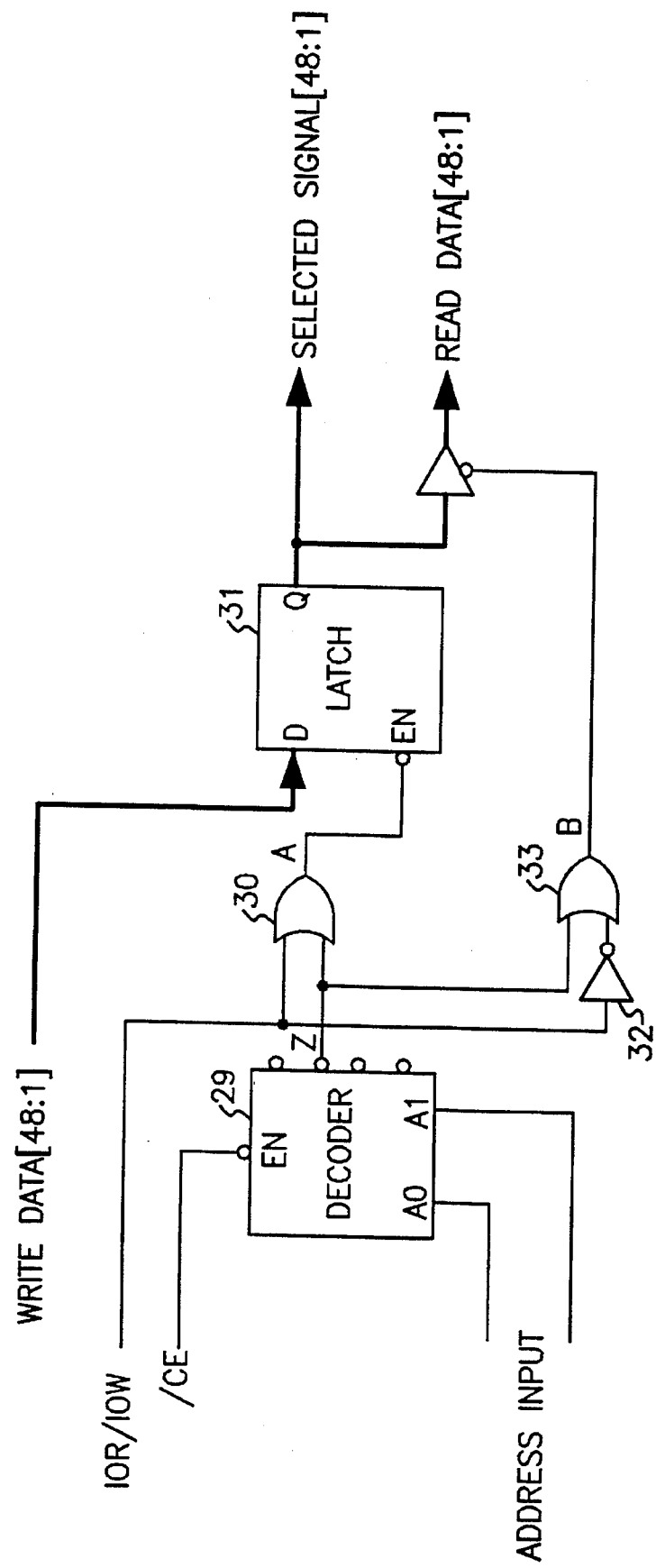
FIG. 8 is a detailed circuit diagram for a selection signal generator in FIG. 2.

FIG. 8 is a detailed circuit diagram for a selection signal generator 28 in FIG. 2.

In the case of a system setup environment of Data Write, when write address and a chip enable signal/CE are inputted to a decoder 29, a logic level "0" is outputted through an output terminal Z according to address decoding and inputted to one input of the input terminals of an OR gate 30, while a driving signal such as Read/Write enable signal IOR/IOW with a logic level "0" is inputted to the other input of the input terminals of said OR gate 30, which finally outputs a logic level 0 and enables a latch 31. Write data [48:1] are outputted through said latch 31 to be provided as the selection signal [48:1] of said simple 2:1 selector.

In the mean time, in the case of a system setup environment of Data Read, a read address input and a chip enable signal/CE are inputted to a decoder 29 and a logic level "0" is outputted through an output terminal Z of the decoder 29 by address decoding to be inputted to one of the input terminals of an OR gate 33.

Also, a Read/Write enable signal, IOR/IOW with a logic level "1" is inverted by an inverter 32 and inputted to the other input terminal of said OR gate 33. Accordingly, said OR gate 33 outputs a logic level "0", drives three-state (3-state) buffer 34 and reads the selection signal data [48:1], which is the output of said latch 31, as the Read data [48:1]. At this time, the output of said OR gate 30 becomes a logic level and said latch is disabled. Accordingly, the output data of said latch 31 does not change.

Figure 9:
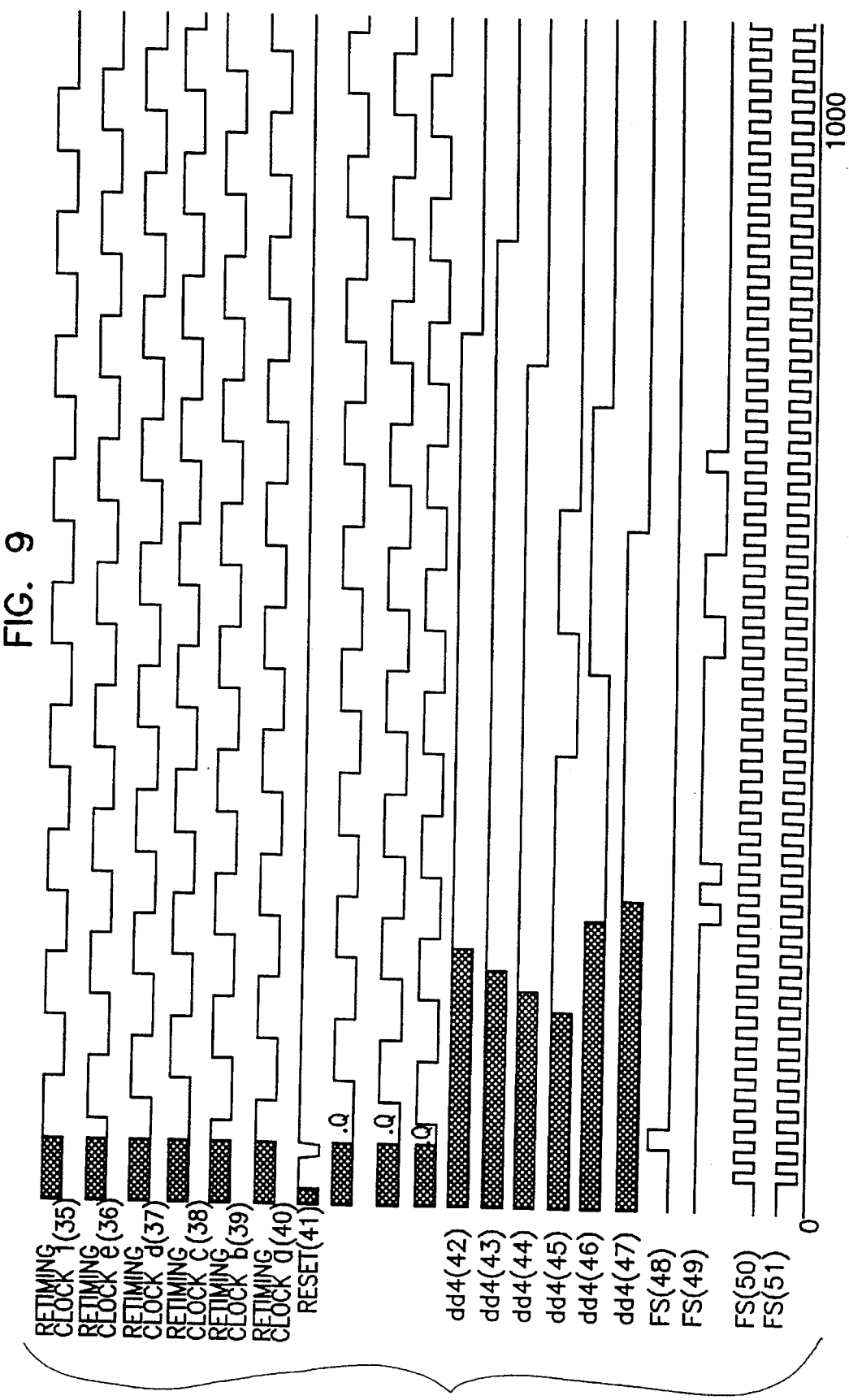
FIG. 9 illustrates a timing diagram for demultiplexing of input data.

FIG. 9 illustrates a timing diagram for the demultiplexed data obtained from the data D1 49 selected by the control signals 35, 36, 37, 38, 39 and 40 generated at a control signal generator 9 and a counter reset signal 41.

Demultiplexed data 42 through 47 are outputted sequentially by clocks 35 through 40 and a reset signal 41 is generated by the input frame pulse selected 48 to reset a counter circuit 18. The wave forms of CLKB 50 and CLK 51 represent the inverse of the selected clock and a selected clock.

Figure 10:
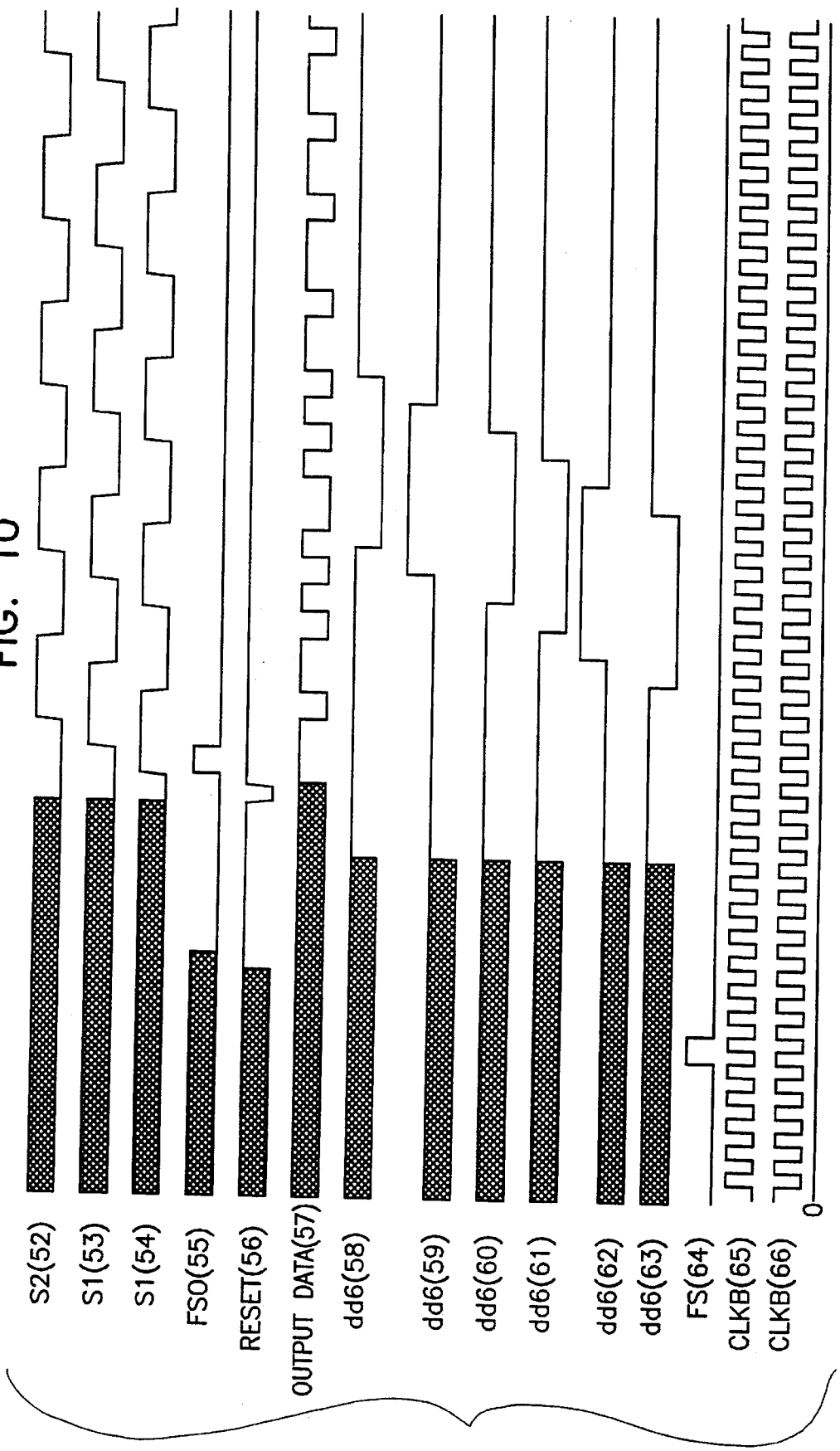
FIG. 10 is a timing diagram for frame synchronization of output data.

FIG. 10 is a timing diagram for the data synchronized and outputted after multiplexing the demultiplexed data 58 through 63 by a reference retiming clock CLK 6 and the control signals S0, S1, S2 54 53 52 generated by a reference signal generator 11.

FS 64 produces a reset signal 56 for resetting a reference counter circuit 24 by a reference frame synchronous input signal. While FSO 55 is an output frame synchronous signal, CLK 66 and CLKB 65 are a wave form of a reference clock and that of the inverse of the reference clock respectively.

As mentioned earlier, since the present invention synchronizes the input data which have different time deviation among one another, it can not only accommodate the time deviations of data at the input terminals, of synchronous transfer system, but also transfer data correctly at the output terminals.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A frame phase aligner for a transfer system, comprising:

selection means for selecting one of a plurality of input signal groups, which include data, a clock signal, an inverse clock signal and a frame synchronous signal, received from outside of said frame phase aligner;

selection signal generating means for providing said selection means with a selection signal according to write data input from outside of said frame phase aligner, so that said selection means selects one of the plurality of input signal groups according to the selection signal indicative of the setup environment of the transfer system;

control signal generating means for generating control clock signals and a retiming control signal in order to demultiplex selected data of the input signal group selected by said selection means;

demultiplexing means for demultiplexing data selected by said selection means to form parallel data, retiming the parallel data, and controlling the phase of the parallel data according to the control retiming signal and the control clock signals output from said control signal generating means, respectively;

multiplexing means for synchronizing the demultiplexed data output from said demultiplexing means to a reference frame synchronous signal and reference control signals; and reference control signal generating means for providing the reference frame synchronous signal and the reference control signals for said multiplexing means.

2. A frame phase aligner in accordance with claim 1, wherein said selection means comprises a plurality of multiplexers for outputting selectively the signals input from outside of said frame phase aligner according to the selection signal from said selection signal generating means.

3. A frame phase aligner in accordance with claim 1, wherein said demultiplexing means produces parallel data from the selected data through a first group of flip-flops serially connected to one another according to the selected inverse clock signal of the input signal group selected by said selection means, performs retiming of the parallel data through a second group of flip-flops connected in parallel according to the retiming control clock signal from said control signal generating means, and then controls the phase of the parallel data which is being retimed by a third group of flip-flops according to the control clock signals having phase-controlled time intervals from said control signal generating means.

4. A frame phase aligner in accordance with claim 1, wherein said control signal generating means comprises:

a counter circuit including a first flip-flop group which is controlled by the selected inverse clock signal;

a second flip-flop group for receiving the output from said counter circuit and outputting the control clock signals and the retiming control signal having different phases according to the selected clock signal; and resetting means for resetting said counter circuit.

5. A frame phase aligner in accordance with claim 1, wherein said multiplexing means comprises:

a multiplexer which multiplexes the parallel data output from said demultiplexing means according to the reference control signals output from said reference control signal generating means; and a flip-flop which receives the output from said multiplexer and outputs finally synchronized data which is retimed according to the reference synchronous clock signal.

6. A frame phase aligner in accordance with claim 1, wherein said reference control signal generating means comprises:

a delaying circuit, which includes a first flip-flop group having a plurality of flip-flops serially connected to one another, for delaying an external reference frame synchronous signal from outside of said frame phase aligner according to a first external clock signal and outputting the reference control frame synchronous signal to said multiplexing means;

a counter circuit, which includes a second flip-flop group, for providing said multiplexing means with the control signals according to a second external clock signal which is out of phase with the first external clock signal; and resetting means for resetting said counter circuit.

7. A frame phase aligner in accordance with claim 1, wherein said selection signal generating means comprises:

decoding means for decoding address signals which are input according to a chip enable signal input from outside of said frame phase aligner;

a first logic operating means for performing an OR logic operation on an output signal from said decoding means and a driving signal from outside of said frame phase aligner;

latch means for receiving write data input from outside of said frame phase aligner, and the output from said first logic operating means as an enable signal, and for generating the selection signal;

a second logic operating means for performing an OR logic operation on the inverted signal of the driving signal and the output signal from said decoding means; and a three-state buffer for outputting the selection signal in said latch means as read data, and being controlled by the output signal from said second logic operating means.

8. A frame phase aligner in accordance with claim 4, wherein said resetting means comprises:

a first flip-flop which receives the selected frame synchronous signal according to the selected inverse clock signal;

a second flip-flop which receives an output from said first flip-flop according to the selected clock signal; and logic OR operating means which outputs a reset signal for resetting said counter circuit after performing an OR logic operation on the inverted output from said first flip-flop and the output from said second flip-flop.

9. A frame phase aligner in accordance with claim 5, wherein said resetting means comprises logically operating means which performs a NAND logic operation for two output signals from the flip-flops in said delaying circuit.

* * * * *

UNITED STATES PATENT AND TRADEMARK OFFICE
CERTIFICATE OF CORRECTION

PATENT NO. : 5,546,401
DATED : August 13, 1996
INVENTOR(S) : Sang H. LEE ET AL.

It is certified that error appears in the above-indentified patent and that said Letters Patent is hereby corrected as shown below:

<u>On the Title Page</u>: item [73] should read

Electronics and Telecommunications Research Institute, Seoul, Republic of Korea and Korea Telecommunication Authority, Seoul, Republic of Korea Signed and Sealed this Thirteenth Day of October 1998

Attest:

BRUCE LEHMAN

*Attesting Officer*      *Commissioner of Patents and Trademarks*